(12) United States Patent
Lee

(10) Patent No.: US 6,329,246 B1
(45) Date of Patent: Dec. 11, 2001

(54) METHOD FOR FABRICATING FLASH MEMORY

(75) Inventor: Hao-Ming Lee, Taichung Hsien (TW)

(73) Assignee: United Microelectronics Corp., Hsinchu (TW)

(*) Notice: Subject to any disclaimer, the term of this patent is extended or adjusted under 35 U.S.C. 154(b) by 0 days.

(21) Appl. No.: 09/467,372

(22) Filed: Dec. 20, 1999

(30) Foreign Application Priority Data

Dec. 21, 1998 (TW) .................................. 87121316

(51) Int. Cl.[7] .............................. H01L 21/8247

(52) U.S. Cl. .......................... 438/264; 438/972

(58) Field of Search .................... 438/257–267, 438/972

(56) References Cited

U.S. PATENT DOCUMENTS

| 5,411,908 | * | 5/1995 | Santin et al. . | |
|---|---|---|---|---|
| 5,453,393 | * | 9/1995 | Bergemont . | |
| 5,712,178 | * | 1/1998 | Cho et al. . | |
| 6,043,123 | * | 3/2000 | Wang et al. | 438/258 |
| 6,071,778 | * | 6/2000 | Bez et al. | 438/257 |
| 6,091,101 | * | 7/2000 | Wang | 257/315 |

\* cited by examiner

*Primary Examiner*—Richard Booth

(57) ABSTRACT

A method of fabricating a flash memory. A P-well is formed in an n-type substrate and an N-well is formed in the P-well. Thus, a bipolar junction transistor is made of the substrate, the P-well and the N-well. A source region and a drain region are formed in the N-well. A tunneling oxide layer, a floating gate, a dielectric layer and a control gate are formed in sequence on the substrate between the source region and the drain region. An erasure method of a flash memory is also disclosed.

6 Claims, 2 Drawing Sheets

METHOD FOR FABRICATING FLASH MEMORY

CROSS-REFERENCE TO RELATED APPLICATION

This application claims the priority benefit of Taiwan application serial no. 87121216, filed Dec. 21, 1998.

BACKGROUND OF THE INVENTION

1. Field of the Invention

The present invention relates to a method of fabricating a flash memory. More particularly, the present invention relates to a method for fabricating a flash memory having a bipolar junction transistor used to do an erase operation.

2. Description of the Related Art

The basic operations of a memory device are write data and read data. The write operation of a flash memory includes a program operation and an erase operation. These two operations are performed by adjusting the threshold voltage of a floating gate. The data stored in the flash memory is changed by performing the program operation and the erase operation.

Fowler-Nordheim tunneling theory is used to perform the erase operation in a p-channel flash memory. Channel hot carrier injection theory or Band-to-Band tunneling theory is used to perform the program operation.

The drawbacks of using Fowler-Nordheim tunneling for the erase operation are low operation efficiency, poor endurance capability, etc.

FIG. 1 is a schematic, cross-sectional diagram used to depict the erase operation of a conventional flash memory.

Referring to FIG. 1, a control gate voltage ($V_{eg}$) is much larger than 0V while performing the erase operation. A drain voltage ($V_d$) and a source voltage ($V_g$) are floating, thus no hot electrons flow between a source region and a drain region. The substrate voltage ($V_{sub}$) is 0V or negative bias. Electrons in the channel tunnel to a floating gate because of Fowler-Nordheim tunneling.

In the method mentioned above, the electrons in the channel tunnel to the floating gate because of a high electrical field produced by the control gate voltage ($V_{eg}$) and the substrate voltage ($V_{sub}$). A tunneling oxide layer between the substrate and the floating gate suffers the high electrical field, so that the lifetime and reliability of the tunneling oxide layer are affected.

SUMMARY OF THE INVENTION

Accordingly, the present invention provides a method of fabricating a flash memory that avoids a tunneling oxide layer from a high electrical field and decreases the erasure time.

To achieve these and other advantages and in accordance with the purpose of the present invention, as embodied and broadly described herein, in one aspect, the invention provides a method of fabricating a flash memory. The method of fabricating a flash memory includes the following steps. A P-well is formed in an n-type substrate. An N-well is formed in the P-well. Thus, a bipolar junction transistor is made of the substrate, the P-well and the N-well. A source region and a drain region are formed in the N-well. A tunneling oxide layer, a floating gate, a dielectric layer and a control gate are formed in sequence on the substrate between the source region and the drain region. In one preferred embodiment of the present invention, a first terminal having the second conductive type, a second terminal having the first conductive type and the third terminal having the first conductive type are formed in the first well, the second well and the substrate, respectively.

In another one aspect, the present invention provides an erasure method for a flash memory having a first well and a second well in a substrate, and a control gate and a floating gate on the substrate. A first terminal, a second terminal and a third terminal are respectively formed in the first well, the second well and the substrate, and a source region and a drain region are formed in the second well. The present erasure method comprises the steps of applying a reverse bias to the first terminal and the second terminal respectively in the first well and second well in the substrate; applying a forward bias to the second terminal and the third terminal respectively in the second well and the substrate; applying a positive voltage to the control gate; and applying a floating source voltage and a floating drain voltage.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
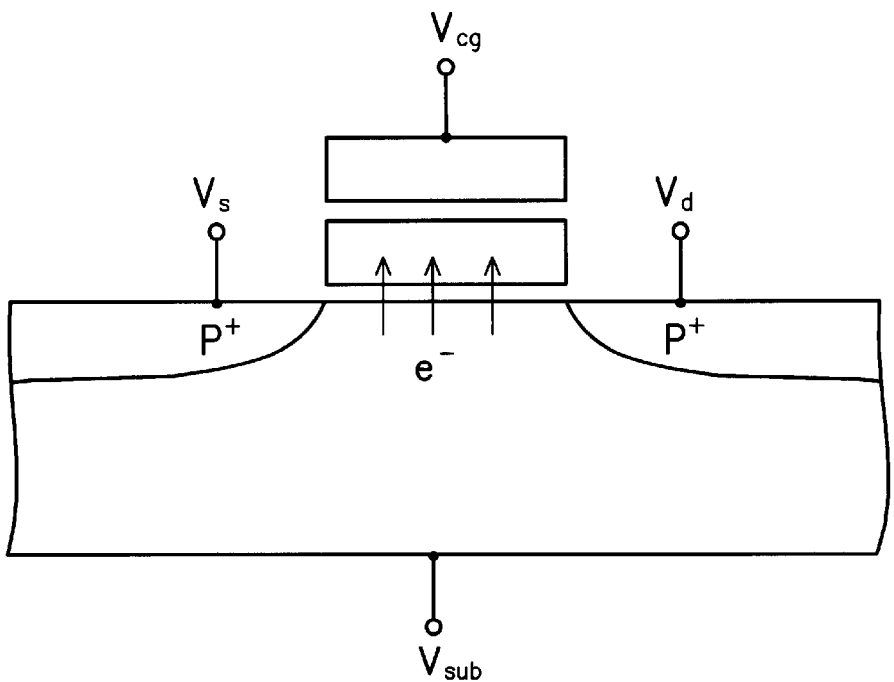
FIG. 1 is a schematic, cross-sectional diagram used to depict the erase operation of a conventional flash memory.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
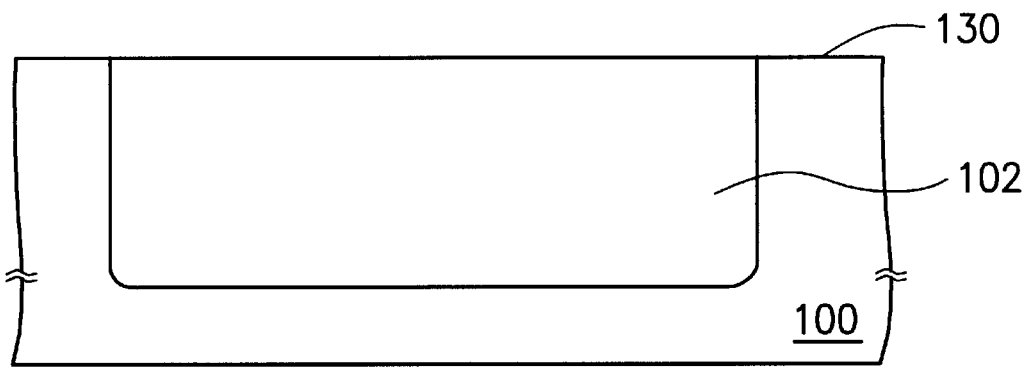
FIGS. 2A through 2C are schematic diagrams used to depict steps in a method according to the invention for fabricating a p-channel flash memory.
Figure 2B:
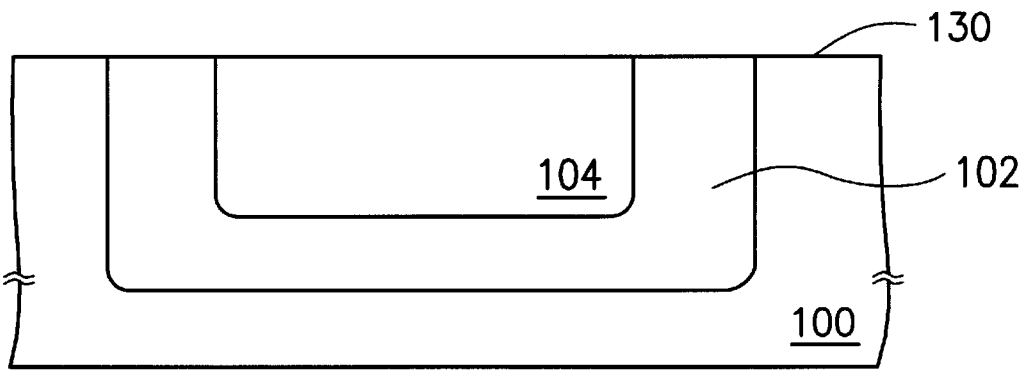
Figure 2C:
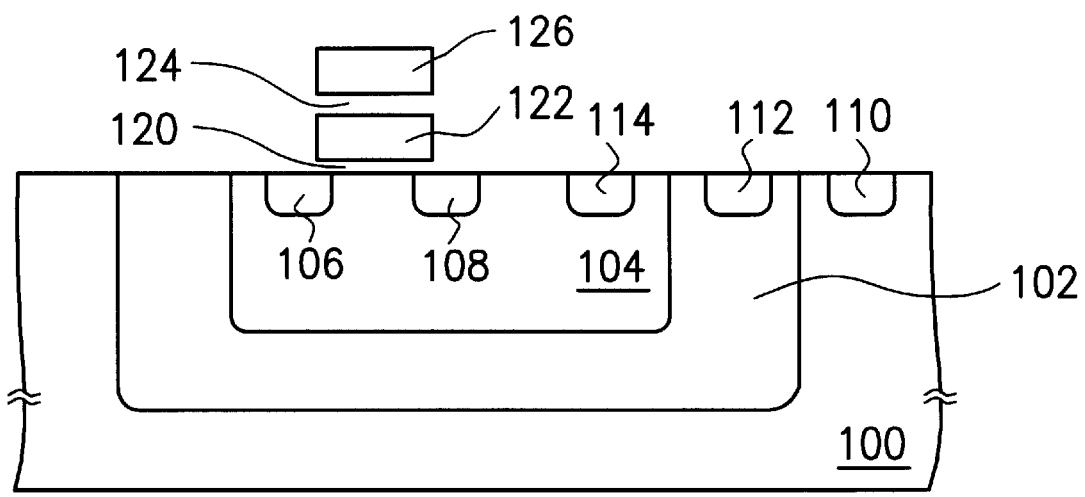

FIGS. 2A through 2C are schematic diagrams used to depict steps in a method according to the invention for fabricating a p-channel flash memory.

Referring to FIG. 2A, a substrate 100 such as an N-type substrate is provided. A P-well 102 is formed in the substrate 100, wherein the P-well 102 is adjacent to a surface 130 of the substrate 100. The step of forming the P-well 102 includes the following steps. A patterned mask layer (not shown) is formed on the substrate 100. A doping process is performed with p-type ions as dopants. The mask layer is removed. The dopants are driven in by performing a thermal process, so that the P-well 102 is formed.

Referring to FIG. 2B, an N-well 104 is formed in the P-well 102, wherein the N-well 104 is adjacent to the surface 130 of the substrate 100. The step of forming the N-well 104 includes the following steps. A patterned mask layer (not shown) is formed on the substrate 100. A doping process is performed with n-type ions as dopants. The mask layer is removed. The dopants are driven in by performing a thermal process, so that the N-well 104 is formed. A bipolar junction transistor is made of the substrate 100, the P-well 102 and the N-well 104.

The purpose of the bipolar junction transistor used in the flash memory is to decrease the control gate voltage ($V_{eg}$), and thus a subsequently formed tunneling oxide layer can avoid suffering a high electrical field. The lifetime and reliability of the tunneling oxide layer are increased. Furthermore, the erasure time is reduced by using the bipolar junction transistor.

Referring to FIG. 2C, a doping process is performed with p-type ions as dopants to form a source region 106 and a drain region 108 in the N-well 104 and a p-plus terminal 112 in the P-well 102. A doping process is performed with n-type ions as dopants to form an n-plus terminal 114 in the N-well 104 and an n-plus terminal 110 in the substrate 100. The n-plus terminal 114, the source region 106 and the drain region 108 are all formed in the N-well 104, and the n-plus terminal 114 does not overlap with the subsequently formed flash memory cell region.

The sequence of doping the p-type dopants and the n-type dopants is not limited; the p-type dopants may be doped after the n-type dopants. After forming the source region 106, the drain region 108 and the terminals 110, 112 and 114, a tunneling oxide layer 120, a floating gate 122, a dielectric layer 124 and a control gate 126 are formed in sequence on the substrate 100 between the source region 106 and the drain region 108.

Figure 3:
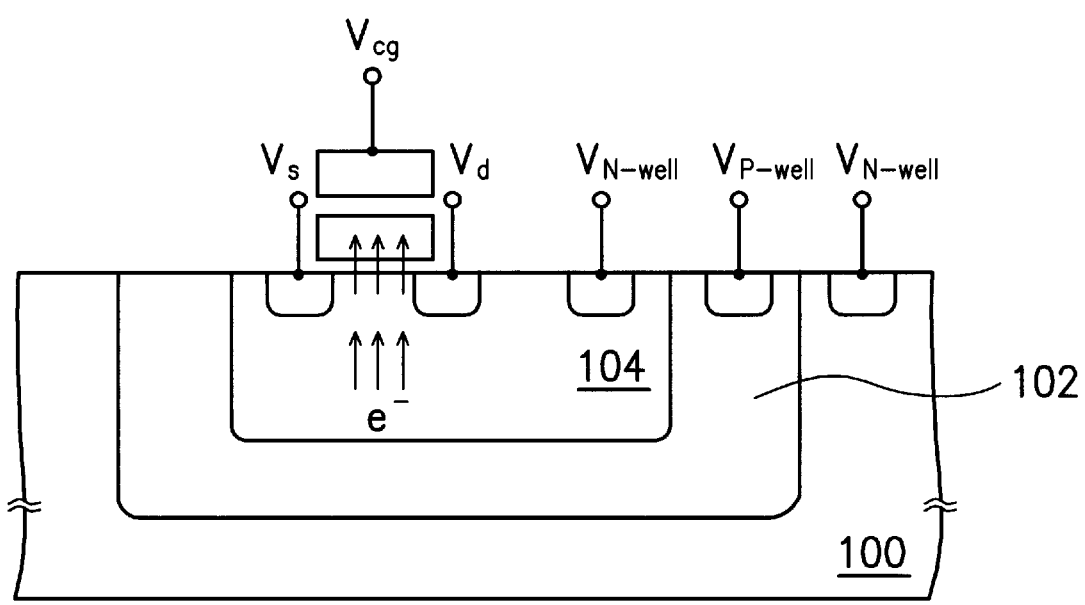
FIG. 3 is a schematic, cross-sectional diagram used to depict the erase operation of a flash memory shown in FIG. 2C.

FIG. 3 is a schematic, cross-sectional diagram used to depict the erase operation of a flash memory shown in FIG. 2C.

Referring to FIG. 3, the control gate voltage ($V_{eg}$) is reduced by using the bipolar junction transistor in the flash memory. The dynamic energy and amounts of carriers injected into the floating gate are all increased and the performance of the erase operation is not decreased. While performing the erase operation, a P-well voltage ($V_{P\text{-}well}$) and a substrate voltage ($V_{sub}$) are applied to a forward bias PN junction. An N-well voltage ($V_{N\text{-}well}$) and the P-well voltage ($V_{p\text{-}well}$) are applied to a reverse bias PN junction. Thus, the bipolar junction transistor is turned on, and high-energy electrons are produced and flow toward the surface of the substrate. A positive voltage is applied to the control gate, wherein the positive voltage is lower than the control gate voltage ($V_{eg}$) used in the conventional process. The drain voltage ($V_d$) and the source voltage ($V_s$) are floating, thus no hot electrons flow between the source region and the drain region. The high-energy electrons are attracted and injected into the floating gate. Table 1 shows the operating voltage of the conventional flash memory and the flash memory having the bipolar junction transistor.

TABLE 1

|  |  | operating voltage |
|---|---|---|
| Flash memory having bipolar junction transistor | $V_{N\text{-}well}$ and $V_{P\text{-}well}$<br>$V_{N\text{-}well}$ and $V_{sub}$ | reverse bias<br>forward bias |

TABLE 1-continued

|  |  | operating voltage |
|---|---|---|
| Conventional flash memory | $V_{cs}$<br>$V_d$ and $V_s$ | positive voltage<br>floating |

In the invention, the performance of high-energy electron injection is higher than the conventional process and the erasure time is reduced. Because the bipolar junction transistor is turned on, the high-energy electrons are produced, so that the control gate voltage ($V_{eg}$) used in the invention is lower than the voltage used in the conventional process. The tunneling oxide layer has a lower electrical field. The lifetime and reliability of the tunneling oxide layer are increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a flash memory, comprising the steps of:

providing a substrate having a first conductive type;

forming a first well having a second conductive type in the substrate so as to form a junction between the substrate and the first well;

forming a second well having the first conductive type in the first well so as to form a second junction between the first well and the second well;

forming a source/drain region having the second conductive type in the second well; and wherein the first junction is applied with a forward bias and the second junction is applied with a reverse bias, so that high-energy electrons are produced to flow towards a surface of the substrate.

2. The method of claim 1, further comprising the step of forming a first terminal having the second conductive type, a second terminal having the first conductive type and the third terminal having the first conductive type in the first well, the second well and the substrate, respectively.

3. The method of claim 2, wherein the second terminal and the third terminal are simultaneously formed before forming the source/drain region.

4. The method of claim 2, wherein the second terminal and the third terminal are simultaneously formed after forming the source/drain region.

5. The method of claim 1, wherein the first conductive type is n-type and the second conductive type is p-type.

6. The method of claim 1, further comprising applying a positive voltage to a control gate of the flash memory for performing an erase operation.

* * * * *